US005905414A

United States Patent [19]
Motoi

[11] Patent Number: 5,905,414

[45] Date of Patent: May 18, 1999

[54] VCO HAVING CONTROL VOLTAGE AND MODULATION SIGNAL APPLIED TO VARACTOR

[75] Inventor: Yasuo Motoi, Oumihachiman, Japan

[73] Assignee: Murata Manufacturing Co., Ltd., Nagaokakyo, Japan

[21] Appl. No.: 08/971,693

[22] Filed: Nov. 17, 1997

[51] Int. Cl.[6] .............................. H03B 5/12; H03C 3/22

[52] U.S. Cl. ................ 332/130; 331/117 D; 331/177 V; 332/136

[58] Field of Search .................................. 332/126, 127, 332/128, 130, 136; 331/36 C, 177 V, 117 D; 455/110, 111, 113

[56] References Cited

U.S. PATENT DOCUMENTS

| | | | |
|---|---|---|---|
| 3,581,240 | 5/1971 | Enderby | 332/136 |
| 4,088,968 | 5/1978 | Pradal et al. | 332/136 |
| 4,303,894 | 12/1981 | Akazawa | 332/135 |
| 5,187,451 | 2/1993 | Nakamoto et al. | 332/136 |

*Primary Examiner*—Siegfried H. Grimm
*Attorney, Agent, or Firm*—Burns, Doane, Swecker & Mathis, LLP

[57] ABSTRACT

A voltage controlled oscillator having a reduced oscillation frequency-modulation sensitivity variation and having a positive modulation function is designed to: (a) reduce the modulation variation by making the rate of change in oscillation frequency with a certain change in a modulation signal generally constant with respect to a wide range of oscillation frequencies; (b) reduce the manufacturing cost by using only one varactor diode; and (c) reduce the cost of a system using the voltage controlled oscillator by eliminating the need for correction of the modulation variation on the side of a system using the oscillator. In a variable capacitance circuit of the voltage controlled oscillator, the cathode of a varactor diode is connected to a control voltage terminal and is also connected to a modulation signal input terminal by a coupling resistor and a voltage dividing resistor.

17 Claims, 2 Drawing Sheets

VCO HAVING CONTROL VOLTAGE AND MODULATION SIGNAL APPLIED TO VARACTOR

The present specification is based on Japanese Patent Document No. 8-306494, which is incorporated herein in its entirety by reference.

BACKGROUND OF THE INVENTION

1. Field of the Invention

The present invention relates to a voltage controlled oscillator and, more particularly, to a voltage controlled oscillator used in a wireless communication system and having a positive modulation function.

2. Description of the Related Art

FIG. 2 shows a conventional voltage controlled oscillator having a positive modulation function. A voltage controlled oscillator 1 shown in FIG. 2 is formed by connecting an oscillation circuit 2, a resonance circuit 3, and a variable capacitance circuit 4. The oscillation circuit 2 has a power supply terminal 5 and an output terminal 6, and the variable capacitance circuit 4 has a control voltage terminal 7 and a modulation signal input terminal 8.

The variable capacitance circuit 4 is formed of two varactor diodes 9 and 10, three capacitors 11, 12, and 13, two resistors 14 and 15, and a microstrip line 16.

In the variable capacitance circuit 4, the anode of the varactor diode 9 is grounded while the cathode of the varactor diode 9 is connected to the resonance circuit 3 by the capacitor 11 and is also connected to the control voltage terminal 7 by the microstrip line 16. The control voltage terminal 7 is grounded via the capacitor 13.

The anode of the varactor diode 10 is grounded while the cathode of the varactor diode 10 is connected to the cathode of the varactor diode 9 by the coupling capacitor 12 and is also connected to the modulation signal input terminal 8 by the resistor 14. The modulation signal input terminal 8 is grounded via the resistor 15.

The oscillation circuit 2 and the resonance circuit 3 are arranged in a conventional manner and the configuration of these circuits will not be described.

In the voltage controlled oscillator 1 arranged as described above, the oscillation circuit 2 oscillates at the resonant frequency of the resonance system formed by the resonance circuit 3 and the variable capacitance circuit 4, and outputs an oscillation signal through the output terminal 6. The resonant frequency of the resonance system can be changed by changing the capacitance of the varactor diodes 9 and 10 constituting the variable capacitance circuit 4. The capacitance of each of the varactor diodes 9 and 10 can be changed by changing the voltage across the diode.

The capacitance of the varactor diode 9 constitutes a main part of the capacitance of the variable capacitance circuit 4. The cathode of the varactor diode 9 is connected to the control voltage terminal 7 to enable the capacitance of the varactor diode 9 to be changed by a DC control voltage input through the control voltage terminal 7. For example, if the control voltage is increased, the voltage across the varactor diode 9 becomes higher, thereby reducing the capacitance of the varactor diode 9. The resonant frequency of the resonance system is thereby increased. That is, the resonant frequency of the oscillation circuit 2 is increased. Conversely, if the control voltage is reduced, the oscillation frequency becomes lower. Thus, the oscillation frequency can be changed by changing the control voltage input through the control voltage terminal. Incidentally, the circuit formed by the microstrip line 16 and the capacitor 13 is provided for the purpose of preventing the impedance of an external circuit connected to the control voltage terminal 7 from influencing the capacitance of the variable capacitance circuit 4, and is arranged to make the impedance at the control voltage terminal 7 seen from the cathode of the varactor diode 9 infinite at a frequency substantially equal to the resonant frequency.

On the other hand, the varactor diode 10 is provided for modulation and the cathode of the varactor diode 10 is connected to the modulation signal input terminal 8 by the resistor 14. The capacitance of the varactor diode 10 can also be changed by the voltage of a modulation signal input through the modulation signal input terminal 8. An AC audio signal is input through the modulation signal input terminal 8. In this case, the capacitance of the varactor diode 10 changes according to a change in the voltage of the modulation signal, thereby changing the resonant frequency of the resonance system. The direction of change in resonant frequency caused by the varactor diode 10 is the same as that caused by the varactor diode 9; the resonant frequency becomes higher if the voltage of the modulation signal is increased, and becomes lower if the voltage of the modulation signal is reduced. Thus, the oscillation signal can be frequency-modulated (positively modulated) with the modulation signal input through the modulation signal input terminal 8. The resistors 14 and 15 are used to divide the modulation signal so as to adjust the voltage of the modulation signal applied to the cathode of the varactor diode 10, thereby adjusting the depth of modulation.

In the above-described variable capacitance circuit 4, the modulation signal input through the modulation signal input terminal 8 is also connected to the varactor diode 9 via the coupling capacitor 12. However, the impedance of the coupling capacitor 12 is set to such a value as to be low at the resonant frequency (ordinarily 1 GHz in portable telephones) and high with respect to the modulation signal (having frequencies about 1 kHz, since the modulation signal is an audio signal). Therefore, the modulation signal does not influence the varactor diode 9.

In the above-described conventional system, however, regarding only the variable capacitance circuit 4, the change in capacitance of the varactor diode 9 according to the control voltage input through the control voltage terminal 7 and the change in capacitance of the varactor diode 10 according to the modulation signal input through the modulation signal input terminal 8 are completely independent of each other. Therefore, the rate of change in the capacitance of the varactor diode 10 with respect to the modulation signal does not vary even when the capacitance of the varactor diode 9, which comprises the main part of the capacitance of the variable capacitance circuit 4, is changed by the control voltage input through the control voltage terminal 7. Consequently, the relative change in the capacitance of the variable capacitance circuit 4 according to the modulation signal is smaller when the capacitance of the varactor diode 9 is large, and is larger when the capacitance of the varactor diode 9 is small.

A problem in such a situation is that the rate of change in the oscillation frequency with a certain change in the modulation signal varies between the case where the oscillation frequency is high and the case where the oscillation frequency is low. In other words, the oscillation frequency-modulation sensitivity variation (modulation variation) is large. There is accordingly a need for means for correcting such a modulation variation on the side of a system using the voltage controlled oscillator, or the like. At the same time, a problem of an increased cost of use of the voltage controlled oscillator must be addressed.

SUMMARY OF THE INVENTION

In view of the above-described problems, an exemplary object of the present invention is to provide a voltage controlled oscillator having a reduced modulation variation and having a positive modulation function.

To achieve the above-described object, according to the present invention, there is provided a voltage controlled oscillator comprising an oscillation circuit, a resonance circuit connected to the oscillation circuit, a variable capacitance circuit capacitive-coupled to the resonance circuit, a control voltage terminal, and a modulation signal input terminal through which a modulation signal is input, the voltage controlled oscillator having a positive modulation function such that the oscillation frequency increases or decreases when the voltage of the modulation signal becomes higher or lower, respectively. The variable capacitance circuit includes a varactor diode and a coupling resistor. The cathode of the varactor diode is connected to the control voltage terminal for direct current conduction. The cathode of the varactor diode is also connected to the modulation signal input terminal for direct current conduction by the coupling resistor.

BRIEF DESCRIPTION OF THE DRAWINGS

The foregoing and other, objects, features and advantages of the present invention will be more readily understood upon reading the following detailed description in conjunction with the drawings in which.

DESCRIPTION OF THE PREFERRED EMBODIMENT

Figure 1:
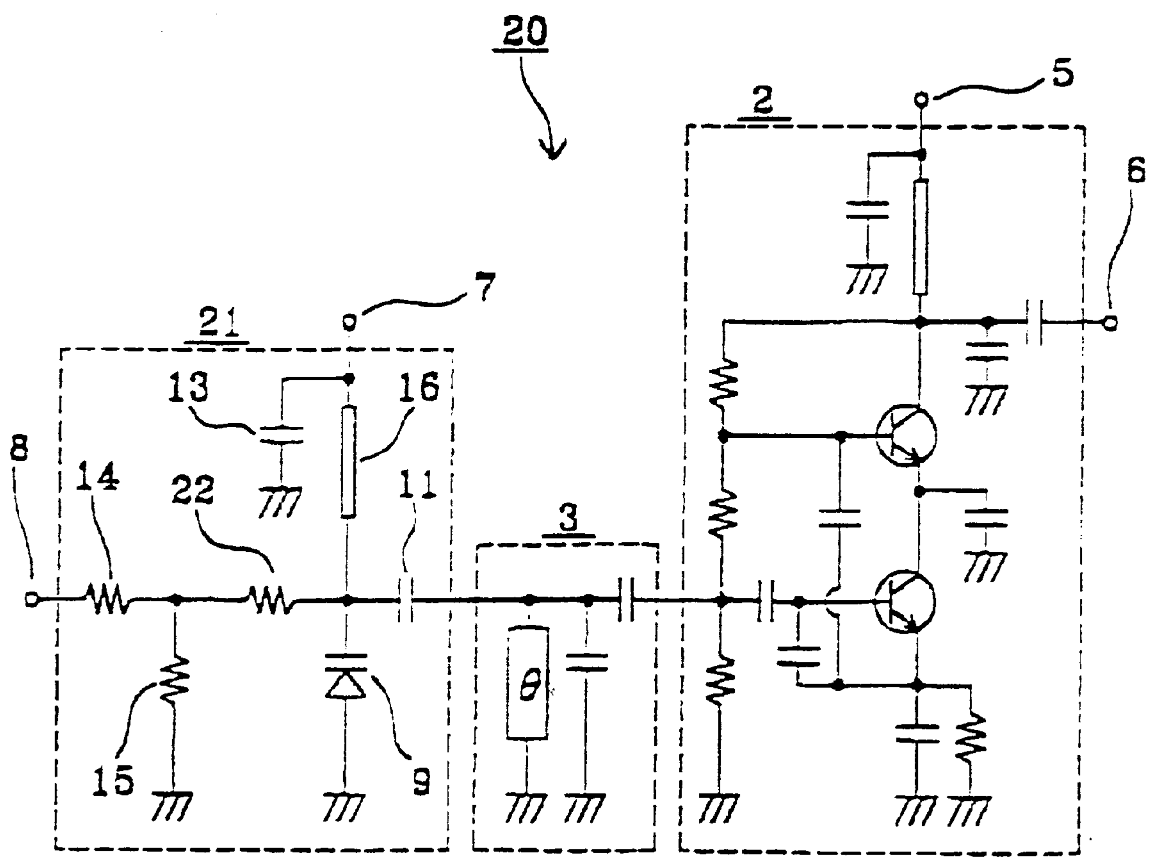
FIG. 1 is a circuit diagram showing an exemplary embodiment of the voltage controlled oscillator of the present invention.
Figure 2:
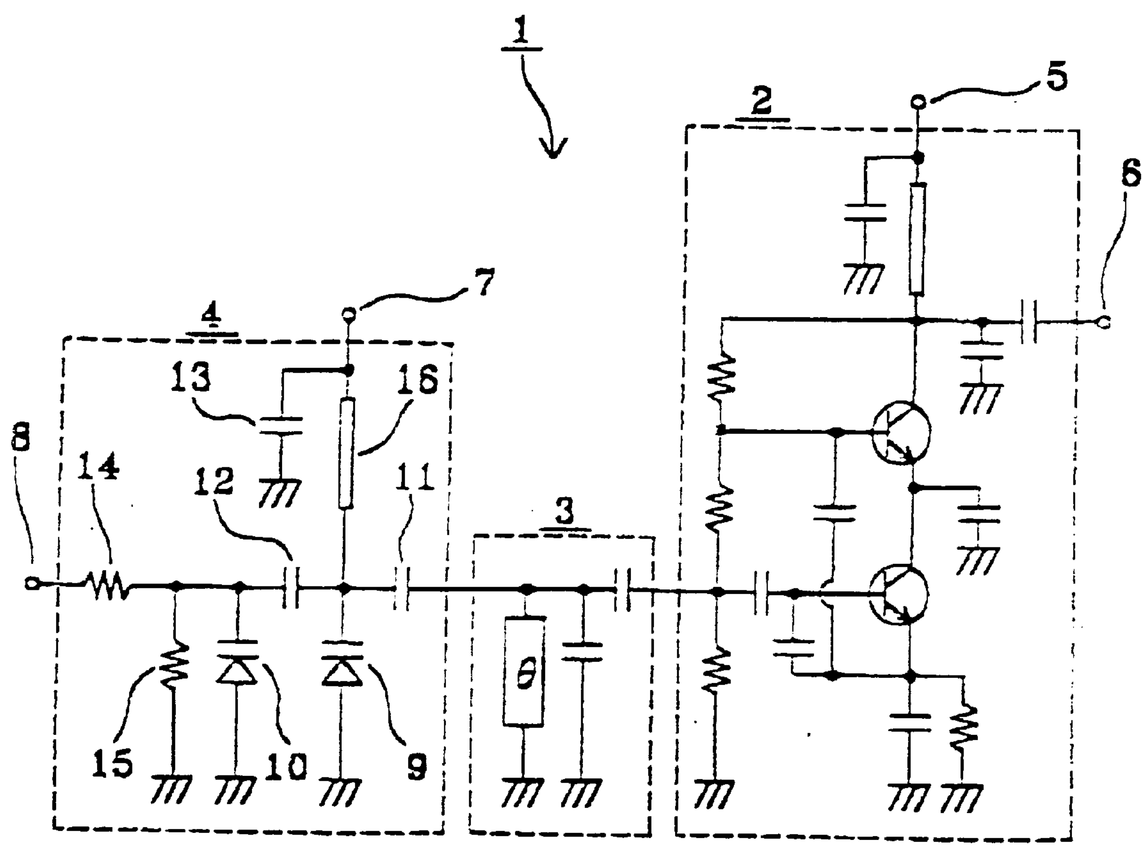
FIG. 2 is a circuit diagram showing a conventional voltage controlled oscillator.

FIG. 1 shows an embodiment of the voltage controlled oscillator of the present invention. The components identical or equivalent to those shown in FIG. 2 are indicated by the same reference numerals in FIG. 1 and the description of these components will not be repeated. Referring to FIG. 1, a variable capacitance circuit 21 of a voltage controlled oscillator 20 is formed of a varactor diode 9, two capacitors 11 and 13, two resistors 14 and 15, a microstrip line 16 and a coupling resistor 22.

In this circuit, the anode of the varactor diode 9 is grounded while the cathode of the varactor diode 9 is connected to the resonance circuit 3 by the capacitor 11 and is also connected to a control voltage terminal 7 by the microstrip line 16. The control voltage terminal 7 is grounded via the capacitor 13.

The cathode of the varactor diode 9 is also connected to a modulation signal input terminal 8 by the coupling resistor 22 and the resistor 14. The modulation signal input terminal 8 is grounded via the resistor 15.

In the thus-arranged variable capacitance circuit 21 of the voltage controlled oscillator 20, the capacitance of the varactor diode 9 constitutes a main part of the capacitance of the variable capacitance circuit 21, and the cathode of the varactor diode 9 is connected to the control voltage terminal 7 to enable the capacitance of the varactor diode 9 to be changed by a DC control voltage input through the control voltage terminal 7. The relationship between the control voltage and the oscillation frequency is the same as that in the arrangement shown in FIG. 2 and the description of this relationship will not be repeated.

On the other hand, the modulation signal input terminal 8 is also connected to the cathode of the varactor diode 9 by the resistor 14 and the coupling resistor 22. A modulation signal input through the modulation signal input terminal 8 is divided by the resistors 14 and 15 and supplied to the cathode of the varactor diode 9 via the coupling resistor 22. The coupling resistor 22 is set to a value (e.g., approximately 3 MΩ) sufficiently larger than the values of the voltage dividing resistors 14 and 15. Therefore, substantially no current flows through the resistor 22 and only a change in voltage at the connection between the resistors 14 and 15 according to the modulation signal is transmitted to the cathode of the varactor diode 9. The voltage across the varactor diode 9 changes thereby to cause a change in the capacitance of the varactor diode 9. The resonance frequency of the resonance system is thereby changed. In this manner, the oscillation signal can be frequency-modulated (positively modulated) with the modulation signal input through the modulation signal input terminal 8.

In this variable capacitance circuit 21, the voltage across the varactor diode 9 is changed by the control voltage input through the control voltage terminal 7 and by the modulation signal input through the modulation signal input terminal 8. In this case, when, for example, the capacitance of the varactor diode 9 is small corresponding to a high level of the control signal, the change in the capacitance of the varactor diode 9 according to the modulation signal is small since the initial value of the capacitance change is small. Conversely, when the capacitance of the varactor diode 9 is large corresponding to a low level of the control signal, the change in the capacitance of the varactor diode 9 according to the modulation signal is large since the initial value of the capacitance change is large.

Consequently, the rate of relative change in the oscillation frequency with a certain change in the modulation signal is generally constant between the case where the oscillation frequency is high and the case where the oscillation frequency is low. Thus, the modulation variation can be reduced. Furthermore, the voltage controlled oscillator of this embodiment can be manufactured at a reduced cost since only one varactor diode is used. Also, the need for correction of modulation variation on the side of a system using the voltage controlled oscillator is eliminated, thereby achieving a reduction in the cost of the entire system.

In the voltage controlled oscillator of the present invention, only one varactor diode is used in the variable capacitance circuit, the cathode of the diode is connected to the control voltage terminal and is also connected to the modulation signal input terminal by a coupling resistance having a large resistance value, so that the rate of relative change in the oscillation frequency with a certain change in the modulation signal is generally constant between the case where the oscillation frequency is high and the case where the oscillation frequency is low, thus reducing the modulation variation.

The cost of the voltage controlled oscillator can be reduced since only one varactor diode is used. Further, the cost of the entire system using the voltage controlled oscillator can be reduced since there is no need for correction of modulation variation on the side of the system using the voltage controlled oscillator.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A voltage controlled oscillator comprising:

an oscillation circuit;

a resonance circuit connected to said oscillation circuit;

a variable capacitance circuit capacitively-coupled to said resonance circuit;

a control voltage terminal; and a modulation signal input terminal through which a modulation signal is input, said voltage controlled oscillator having a positive modulation function such that the oscillation frequency increases or decreases when the voltage of the modulation signal becomes higher or lower, respectively, wherein said variable capacitance circuit includes a varactor diode and a coupling resistor, the cathode of the varactor diode being connected to said control voltage terminal for direct current conduction, the cathode of the varactor diode being also connected to said modulation signal input terminal for direct current conduction by the coupling resistor.

2. The voltage controlled oscillator of claim 1, further including a first voltage-dividing resistor connected between said modulation signal input terminal and said coupling resistor.

3. The voltage controlled oscillator of claim 2, further including a second voltage-dividing resistor connected at one end between said first voltage-dividing resistor and said coupling resistor, and connected at another end to ground.

4. The voltage controlled oscillator of claim 3, wherein said coupling resistor has a significantly larger resistance than said first and second voltage-dividing resistors, such that minimal current flows through said coupling resistor.

5. The voltage controlled oscillator of claim 4, wherein said coupling resistor has a resistance of approximately 3 MΩ.

6. The voltage controlled oscillator of claim 1, wherein the cathode of the varactor diode is connected to said control voltage terminal via a microstrip line.

7. The voltage controlled oscillator of claim 1, wherein the cathode of the varactor diode is connected to said resonance circuit via a capacitor.

8. The voltage controlled oscillator of claim 1, wherein said modulation signal input terminal receives an AC signal.

9. A variable capacitance circuit capacitively-coupled to a resonance circuit, which, in turn, is coupled to an oscillation circuit, comprising:

a control voltage terminal through which a control signal is input;

a modulation signal input terminal through which a modulation signal is input; and a varactor diode and a coupling resistor, the cathode of the varactor diode being connected to said control voltage terminal for direct current conduction, the cathode of the varactor diode being also connected to said modulation signal input terminal for direct current conduction by the coupling resistor.

10. The variable capacitance circuit of claim 9, further including a first voltage-dividing resistor connected between said modulation signal input terminal and said coupling resistor.

11. The variable capacitance circuit of claim 10, further including a second voltage-dividing resistor connected at one end between said first voltage-dividing resistor and said coupling resistor, and connected at another end to ground.

12. The variable capacitance circuit of claim 11, wherein said coupling resistor has a significantly larger resistance than said first and second voltage-dividing resistors, such that minimal current flows through said coupling resistor.

13. The variable capacitance circuit of claim 12, wherein said coupling resistor has a resistance of approximately 3 MΩ.

14. The variable capacitance circuit of claim 9, wherein the cathode of the varactor diode is connected to said control voltage terminal via a microstrip line.

15. The variable capacitance circuit of claim 9, wherein the cathode of the varactor diode is connected to said resonance circuit via a capacitor.

16. The variable capacitance circuit of claim 9, wherein said modulation signal input terminal receives an AC signal.

17. A method for controlling an oscillation circuit using a variable capacitance circuit capacitively-coupled to a resonance circuit, comprising the steps of:

receiving a DC control voltage through a control voltage terminal of said variable capacitance circuit;

supplying said DC control voltage via a microstrip line to a cathode of a varactor diode;

receiving an AC modulation signal through a modulation signal input terminal of said variable capacitance circuit; and supplying a voltage component of said AC modulation signal to said cathode of said varactor diode, whereby variations in an oscillation frequency produced by said variable capacitance circuit are substantially constant for different oscillation frequencies.

* * * * *

UNITED STATES PATENT AND TRADEMARK OFFICE

CERTIFICATE OF CORRECTION

PATENT NO. : 5,905,414

DATED : May 18, 1999

INVENTOR(S) : Yasuo MOTOI

It is certified that error appears in the above-identified patent and that said Letters Patent is hereby corrected as shown below:

On title page, left column, between lines 8 and 9, please add:

-- [30] Foreign Application Priority Data

November 18, 1996 [JP] Japan .......................8-306494 --

Signed and Sealed this

Seventh Day of September, 1999

Attest:

Q. TODD DICKINSON

*Attesting Officer*

*Acting Commissioner of Patents and Trademarks*